United States Patent Office 3,594,243
Patented July 20, 1971

3,594,243

FORMATION OF POLYMERIC RESISTS

Albert S. Deutsch, Vestal, and William G. Herrick, Binghamton, N.Y., assignors to General Aniline & Film Corporation, New York, N.Y.

No Drawing. Filed Feb. 7, 1967, Ser. No. 614,412
Int. Cl. B23p *15/00;* B24b *1/00;* C23f *1/00*
U.S. Cl. 156—13 14 Claims

ABSTRACT OF THE DISCLOSURE

Polymeric resist-image formation involving the irradiation of a maleic anhydride polymer coating with corpuscular radiation, e.g., an electron beam, whereby to insolubilize the exposed areas, resist-image formation being effected by solvent treatment of the polymer coating.

The present invention relates in general to the provision of compositions and process used in connection with the formation of etched patterns on an object and in particular to the provision of resinous compositions advantageously adapted to such purposes.

As is well known, processes designed to provide a surface with a pattern or other informational indicia can be implemented to particular advantage according to technique which are essentially photographic in nature as for example, those involving the radiation-induced formation of a polymeric resist image, the latter serving as a mask whereby to permit differential treatment of the object surface protected by such resist image. In general, such methods are characterized by a sequence of operations which include, providing the surface to be treated with a coating possessed of a high order of actinic response, i.e., one which undergoes a chemical and/or physical change when subjected to high energy radiation, exposure of such a layer to an image-wise radiation pattern followed by the step of selectively removing as by solvent treatment the exposed or unexpossed areas of the resist layer. The subjacent portions of the surface in question laid bare by the solvent treatment may then be treated directly in a suitable manner depending upon the nature of the reproduction process in order to provide the desired surface pattern. The aforedescribed chronology of operations has proved to be particularly beneficial in connection with commercial applications involving the reproduction of design, patterns, etc. of a highly detailed and complex nature and wherein exactness and preciseness of reproduction is imperative, e.g., the preparation of printed circuits, semi-conductors, printing plates, and the like. Processes associated with reproduction techniques of the latter type invariably involve an etching operation whereby the object surface is physically modified or otherwise treated to provide a permanent replica of the exposure pattern. If required or desired, such pattern may be rendered visually comprehensible by the use of suitable colorants, e.g., dyes pigments, toners, powders, etc.

The methods heretofore promulgated in the art for carrying out procedures of the aforedescribed type are to a great extent photolytic in nature and thus make mandatory the use of resist forming compositions containing as an essential ingredient a substance capable of undergoing insolubilization in the presence of light energy, i.e., visible radiation, U.V., etc. Typical of procedures of the latter type are those for example based upon the use of a light-sensitive photopolymerizable composition containing an image-forming system comprising one or more polymerizable vinyl type monomers, i.e., those containing the $CH_2{=}C{<}$ group in conjunction with a photo-activator, i.e., a substance which undergoes a photolytically induced reaction with the liberation of species capable of initiating the polymerization of the vinyl monomer component. Thus, resist formation occurs with the foregoing compositions by virtue of the fact that the photolytically induced photopolymerization results in the formation of insolubilized portions in those areas subjected to the actinic effects of the exposure radiation. As will be appreciated, many ramifications and modifications of such a process are currently enjoying widespread commercial exploitation; however, such methods are uniformly characterized in that successful implementation requires the utilization of visible light, U.V., etc. Such a requirement poses several significant disadvantages which have tended to retard even further commercialization of such techniques. Firstly, many of the photoactivator catalyst materials are extremely costly and thus represent a significant cost increment to the overall processing. Secondly, the formation of polymeric resists of sufficient structural stability, solvent resistance, reproduction quality, etc., requires practically, without exception, the use of inordinately high exposure levels and thus, the use of high energy light sources and/or protracted exposure intervals in order to achieve the requisite exposure dosage; as will be appreciated, the definite likelihood exists that one or more of the components present in the photopolymerizable layer composition may be deleteriously affected. For example, the heat effects which attend the use of high strength light energy sources may give rise to spurious thermally induced catalyst decomposition with the concomitant generation of polymerization initiating species. The latter condition is often manifested in what may be termed, by way of analogy to silver halide photography, a fog density which of course tends to vitiate attempts to achieve quality reproduction. Correlatively, the use of protracted exposure intervals to compensate for reduced intensity levels, greatly increases the processing time required for completing the photopolymerization process with the concomitant enhancement in production costs.

In an attempt to overcome or otherwise mitigate the disadvantages inherent in techniques of the type described, considerable industrial activity has centered around the research and development of more effective resist forming compositions, i.e., vinyl monomers, photoactivators, catalysts, catalyst accelerators and the like. Despite the meritorious achievements in this regard, the procedures and compositions thus far evolved, have in the vast majority of commercial applications, provided but marginal improvement.

One of the techniques which has been ascertained to provide significant industrial advantage is that based upon the use of high energy corpuscular radiation in lieu of visible light, ultra-violet light, etc. The advantages inherent in such techniques are of the first order of significance with perhaps the salient improvement relating to the fact that exposure levels, reduced to an extent heretofore considered unattainable, can be efficaciously employed. This is due to the fact that the energy of an electron, for example, subjected to high voltage acceleration on the order of 15 kv. has several thousand times the energy of a photon in the visible portion of the spectrum. Thus, the exposure time required constitutes but a fraction of that necessary for successful implementation of phototype techniques. Moreover, the resist forming compositions utilized in conjunction with electron beam recording do not require the observance of special techniques for handling, storage and the like since they are devoid of sensitivity in the visible and ultra-violet portions of the spectrum. Thus, the exposures may be effected under daylight conditions, etc. A further advantage of recording processes based upon the use of electron beams or other corpuscular radiation relates to the fact that the beam of high energy particles can be accurately controlled and thus the image to be reproduced can be scanned therewith according to a pre-determined pattern, i.e., a programmed scanning movement. This represents a particularly important advantage for the following reason. In conventional resist-forming techniques which depend for operability on the photolytic effects of the exposure radiation, the pattern or information to be reproduced must first be provided in the form of a drawing or design. It is then required that a suitable photographic negative be prepared therefrom, the latter being used for contact printing directly onto the resin-coated surface. In contradistinction, the electron beam recording procedures obviate completely any necessity for the preparation of a negative material since the electron beam may be utilized directly for exposing the resist forming layer according to the pre-determined programmed scanning movement. In addition, the high quality and detail of image reproduction made possible by electron beam recording techniques, making possible high resolution reproduction of fine detail can be utilized to exceptional advantage in the fabrication of printed cricuits wherein such factors are of critical importance. However, despite the manifold advantages presented by electron beam recording techniques, serious difficulties have nevertheless been encountered in its practice which have tended to detract from its commercial desirability. The predominant portion of the problems encountered relates to the nature of the resist-forming composition per se. To a great extent, the materials employed in this regard have comprised monomer or prepolymer substances which undergo an insolubilization reaction when subjected to corpuscular radiation, thereby permitting selective removal of unexposed or exposed areas. The resist forming material employed should, ideally, possess a number of properties enabling their ready and efficacious deposition in the form of a uniform and continuous film, their use with a wide variety of etching solutions, and, of course, their ready removal by relatively simple means. However, the polymeric materials heretofore proposed for use in such a relationship have been found to be notably deficient in one or more important criteria. For example, many of such materials possess limited solubility characteristics and thus can be effectively employed with but a relatively limited number of solvents. Since the nature of the solvent will, in many instances, influence to a significant extent the economics involved, such a factor assumes considerable importance. Other materials although readily soluble in the vast number of commercial solvents conventionally employed, nevertheless are undesirable from the standpoint of being poor film formers. It is of utmost importance, of course, that the resist forming material employed be capable of ready deposition to an object surface whether metal, glass, plastic, etc. and whether such surface be planar, arcuate or otherwise irregular in configuration, in the form of a uniform continuous film, i.e., substantially devoid of physical irregularities. It is imperative that the resist forming layer present a surface which is uniformly impervious throughout its extent to the etching solution employed at various stages of the processing, i.e., the solutions utilized for post-exposure removal of the non-insolubilized resin areas as well as the solution employed for etching the object surface. As will be readily obvious, any coating imperfection may well reduce the impenetrability of the resist layer and thus totally frustrate the attempted achievement of quality reproduction. Other resinous materials proposed for such purposes despite favorable properties of solubility and film-forming, have nevertheless been found to be objectionable in possessing sub-optimum resistance to the penetrating effects of the etch solutions contemplated for use. The significance of this particular property hardly requires comment; suffice to say that the resist forming layer should be totally impervious, i.e., provide a total diffusion barrier, to the etching solution and especially that employed for etching the object surface; otherwise the purposive nature of the entire process scheme is vitiated since the etching effects are not confined to those areas of the object surface laid bare by the solvent treatment. The polymeric substance employed as the resist forming agency should, in addition to the above enumerated properties, be capable of ready removal from the object surface following completion of the etching operation. With much of the prior art processing, it is necessary, in order to achieve the requisite degree of etch solution diffusion-resistance, to subject the resist forming layer following the solvent removal step to some type of ancillary operation designed to enhance the stability characteristics of such layer. For example, severe heat treatments are necessary in order to enhance the strength of the adhesion bond extant between the resin layer and the object surface and to otherwise augment the imperviousness of the resin layer. Such operations correspondingly aggravate the problems associated with removal of the resin layer from the object surface as a final step in the processing, i.e., render ineffective the more palatable removal techniques, i.e., by dissolution, since the solvent capacity of the vast majority of chemicals conventionally employed for such purposes was correspondingly diminished. Typically, it was found necessary to resort to the use of highly burdensome mechanically-oriented techniques for accomplishing such removal, i.e., techniques including as an essential operation some type of mechanical abrasion, scraping, etc. In many instances, damage to the object surface was unavoidable. Furthermore, problems of this nature are found to persist to an intolerable extent despite the use of resin materials which do not require anything in the nature of a special treatment for purposes of accomplishing a firm adhesion bond between the resin layer and the object surface.

In accordance with the discovery forming the basis of the present invention, it has been ascertained that the use of a relatively de-limited class of polymeric materials in resist forming composition adapted specifically for use in connection with electron beam or other corpuscular radiation recording methods makes possible the optimum realization of the advantages inherent in such recording techniques while eliminating substantially the undesirable features characterizing techniques heretofore provided in this regard.

Thus, a primary object of the present invention resides in the provision of a process for the formation of a polymeric resist utilizing an electron beam or other corpuscular radiation wherein the aforementioned disadvantages are eliminated or at least mitigated to a substantial extent.

Another object of the present invention resides in the provision of a process for the preparation of polymeric resists utilizing electron beam or other corpuscular radiation and employing a resist-forming composition which exhibits excellent film-forming characteristics, favorable solubility, exceptional resistance and imperviousness to etching solutions and which may be readily removed from an object surface by a simple alkaline solvent treatment.

A further object of the present invention resides in the provision of a process for the formation of an etched pattern in an object surface which makes possible substantial reduction in cost and time of processing and significant increases in product throughput.

Other objects and advantages will become apparent hereinafter as the description proceeds.

The attainment of the foregoing objects is made possible in accordance with the present invention which, in its broader aspects, provides a process for the preparation of an etched pattern on an object surface which comprises exposing to electron beam or other corpuscular radiation a surface coated with a composition comprising a polymer of maleic anhydride, i.e., homopolymer, copolymer, interpolymer, etc. containing from about 10% to about 65% on a mole basis of maleic anhydride units and having a specific viscosity ranging for 1% solutions in methylethyl ketone at 25° C. from about .05 to about 5.0 said exposure being sufficient to cause insolubilization in the exposed areas, and removing the unexposed portions of said coating by washing to provide a resist image.

It is of critical importance to the advantages made possible by the present invention that the polymer material present in the resist forming composition contain on a mole basis from about 10% to about 65% of maleic anhydride units. The manifold advantages seemingly atypical to maleic anhydride polymers of this type cannot be positively explained by reference to current theory or exposition on the subject. Regardless of the theory involved, it is nevertheless manifestly clear that such polymer materials possess an optimum combination of advantageous properties, i.e., film-forming, solubility, impenetrability to etching solutions, etc., which renders their use in resist forming techniques involving corpuscular radiation particularly advantageous.

As indicated hereinbefore, the maleic anhydride polymeric derivative may comprise simply a homopolymer containing of course from about 10% to about 65% of the anhydride unit, i.e., non-hydrolyzed, or alternatively a polymeric substance derived from the copolymerization of maleic anhydride with one or more copolymerizable mono-ethylenic unsaturated vinyl monomers containing the grouping $CH_2=C<$. Comonomer material found to be suitable for use in forming the maleic anhydride copolymers may be selected from a wide variety of materials and in general encompass vinyl type monomers copolymerizable with maleic anhydride and containing a single ethylenically unsaturated double bond. Typical representatives of such monomers include, for example, the vinyl alkyl ethers of the formula $CH_2=CH—OR$ wherein R represents alkyl of from 1 to 20 carbon atoms which may be straight chained or branched and which may in turn be substituted by inert innocuous groups, e.g., alkyl, aryl, alkoxy, halogen, etc. Other monomer materials which may be employed in this regard include, for example, ethylene, propylene, styrene, p-chloro, p-methoxy, p-methylstyrene and the like.

In certain instances such as for example where the maleic anhydride polymer material is prepared by the copolymerization of an alkyl vinyl ether and maleic anhydride the product polymer mixture will contain varying quantities of not only the PVM/MA material but in addition homopolymeric derivatives of either or both of the monomer reactants, i.e., homopolymers of maleic anhydride and/or the alkyl vinyl ether. The latter materials in no way deleteriously affect the properties desired in the maleic anhydride containing polymer mixture provided of course that the total amount of maleic anhydride present corresponds to the mole percent range hereinbefore stated. Thus, there would be no necessity for resorting to extraneous operations designed to effect the separation of the homopolymeric alkyl vinyl ether, for example, from the polymer mixture. In fact, the presence of the additional polymer substances may in some instances be advantageous as for example in providing greater latitude for controlling polymer viscosity. In any case, however, it is of extreme importance that the maleic anhydride content of the polymer material whether comprising copolymeric maleic anhydride and/or homopolymeric maleic anhydride, correspond to the range previously indicated. Thus, the polymer material employed may be selected from a relatively wide range of materials; however, particularly beneficial results are noted to obtain with the use of copolymers derived from the copolymerization of maleic anhydride with an alkyl vinyl ether, e.g., methyl vinyl ether, isobutyl vinyl ether, dodecyl vinyl ether, hexadecyl vinyl ether and octodecyl vinyl ether. Maleic anhydride-$\alpha,\beta$-ethylenically unsaturated hydrocarbon copolymers, e.g., ethylene, are likewise found to be particularly effective. The coating composition suitable for use herein may be simply prepared by dissolving the maleic anhydride polymer in a suitable solvent to provide a solution of the desired solids concentration. For most of the industrial applications contemplated by the subject invention, it is found that employment of the maleic anhydride polymer material in concentrations ranging from about 10 to about 65% and preferably from about 25% to about 55% by weight provides beneficial results. The solvent employed may be any of those conventionally employed for providing dispersed solutions of maleic anhydride polymers and include for example, methyl-ethyl ketone, dimethyl ketone, acetone, methanol, ethanol, chloroform, dimethyl formamide, dioxane, etc. Other materials may be included if desired in the coating composition for purposes of facilitating deposition of the polymer in the form of a uniform, continuous film. Thus, the polymer solution may include coating aids, dispersing agents, stabilizers and the like. This polymer coating composition may be applied to the object surface in question by any of the methods customarily employed in the art for such purposes, e.g., flow, spray, brush, air brush, bead, etc. It will be understood, of course, that the geometric shape of the object surface will to a great extent dictate the efficacy of a given coating method. The thickness of the coating thus deposited should be maintained within a range of from about 0.1 to about 50 microns and preferably from 0.5 to about 10 microns; in this regard it should be pointed out that the present invention makes possible the effective use of vastly reduced coating thicknesses in view of the superior etch solution resistance of the maleic anhydride polymer materials. In contradistinction, effective implementation of prior art methods made mandatory the use of rather exaggerated coating techniques in order to provide a coating having the requisite impermeability and resistance to chemical attack by the various etch solutions. The disadvantages attending the use of coating compositions having substantial thickness are largely self-evident; for example, it becomes necessary to either increase the activity of the developer solution, i.e., the solution employed to remove the non-exposed areas of the polymer coating which can be accomplished by heating such solution or conversely to prolong the period of contacting the developer solution with the polymer coating in order to assure complete removal of the desired areas of the polymer coating. In some cases, the thickness of the resist-coating may make necessary the utilization of abrasive mechanical treatment in order to completely remove the desired polymer portions, e.g., by rubbing, scraping and the like. As will be readily evident, treatments of this nature inevitably result in injury to the plate. It will also be recognized that thicker coatings tend to vitiate attempts to achieve high quality reproduction particularly high resolution. It is further to be kept in mind that very thin coatings are required for the production of detailed patterns such as those used in micro circuits. In order to ameliorate the foregoing difficulties. it was necessary with the polymer materials heretofore promulgated in the art to resort to ancillary techniques for purposes of augmenting the coating imperviousness to solutions conventionally employed in etching the object surface and especially in those instances where such surface was metallic in nature. Such ancillary techniques include, for example, a heat treatment operation subsequent to the image-wise solution removal of the resist layer and prior to surface etching, e.g., metal etching. Operations of the latter type become more critical as the thickness of the resist layer was reduced. However, the maleic anhydride polymer materials contemplated for use in accordance with the present invention not only make feasible the use of reduced coating thicknesses but, concomitantly, completely obviate any necessity for the use of ancillary operations of the aforedescribed type whereby to convert such coating to a more resistant form.

The polymer coating thus deposited may be thereafter exposed image-wise to the desired pattern by the use of either high- or low-energy corpuscular radiation, e.g., electrons, the preferred exposure source comprising a conventional cathode ray tube. Either low energy or high energy electrons may be utilized for the exposure, i.e., accelerating potentials within the range of from about 1 to about 100 kv. In general, however, the lower range of accelerating potentials, i.e., from about 6 to about 30 kv. are preferred since they are more conducive to greater efficiency; thus, it is found that the high energy of electrons such as those in the 60 to 80 kv. range exhibit a pronounced tendency to penetrate the resist forming layer and thus to this extent represent unexpended energy and is wasted. As will be recognized, the efficacy of a given accelerating potential and thus its propriety of use will be dictated in large part by the thickness of the resist forming layer composition. As a general postulate, the accelerating potential and thus the penetrating power of the corpuscular radiation used in the exposure step is increased within the ranges stated with increased thicknesses of resist forming layers. In any event, the optimum correlation of the accelerating potential with coating thickness can be readily determined by routine laboratory investigation. In general, it has been ascertained that an exposure sufficient to yield an electron density of about $10^{14}$ electrons/$cm.^2$ is eminently suitable for producing high quality energy reproduction and resists having the requisite resistance to the etching solutions employed. The aforementioned electron density value comprises suitable indicia for representing the sensitivity of the resist forming compositions of the present invention, i.e., in terms of number of electrons per sq. cm. of surface area of such compositions. Such sensitivity measurements are obtained according to a procedure which involves incorporating a blue dye into the resist forming composition, the dye providing means whereby visual comprehension of the extent of polymer insolubilization as the exposure proceeds is made possible. Thus, it has been determined that in order to obtain an optical density of 0.5 it is necessary to employ an exposure level sufficient to yield an electron density of $10^{14}$ electrons/$cm.^2$ As previously mentioned, the exposure may be carried out according to a predetermined programmed scanning movement or alternatively by the utilization of a wide angle corpuscular radiation beam whereby the entire image to be reproduced is sensed simultaneously. The latter procedure would be applicable, for example, in those instances wherein the exposure is to be made through a negative or other image bearing medium. In general, it is found that the beam of corpuscular radiation, e.g., electrons requires a high vacuum system on the order of $10^{-4}$ mm. for proper functioning. Despite this requirement the process of the present invention may be implemented in either continuous or batch fashion. Thus, continuous processing whereby a plurality of resist forming coatings are transported through the exposure zone in continuous intermittent fashion may be readily effected by the use of a vacuum transfer lock system, the latter enabling the resist forming compositions to be continuously inserted into and removed from the vacuum chamber containing the electron beam gun or other corpuscular radiation source without any loss of vacuum. Devices for such purposes are well known in the art and are currently available commercially. One such device found to be admirably suited to the purposes of the present invention is that currently available commercially under the trade name designation "Vac-U-Lok," supplied by Vacuum Processing Inc., Richardson, Tex. Upon completion of the required exposure, there is obtained in the resist-forming layer a latent image with the exposed areas being represented by insolubilized maleic anhydride polymer material. The non-exposed, i.e., non-insolubilized portions are then removed by treating such layer with a suitable solvent e.g., methyl-ethyl ketone, dimethyl ketone, diethyl ketone, i.e., any of the solvents previously enumerated and which exhibit a solvent potential for the non-insolubilized maleic anhydride polymer material. The subsequent areas of the object surface laid bare by the solvent removal operation may thereafter be treated with a suitable etching solution the nature and activity of which being controlled by the nature of such object surface, i.e., whether it be metallic, glass, plastic, etc. For example, with metallic surfaces such as copper, aluminum, etc., the conventional etch solutions may be employed; thus, a solution of ammonium persulfate and sulfuric acid containing a minute amount of mercuric chloride provides a particularly beneficial etch for copper surfaces; aluminum surfaces may be readily etched with hydrochloric acid solutions. With respect to non-metallic object surfaces it has been found that hydrofluoric acid solutions may be used for the etching of glass and ceramic materials. Solutions of hydrofluoric and nitric acids may be used for the etching of silicon, germanium, etc.

Depending upon the type of article being fabricated according to the aforedescribed process, it may be desirable to render the etched portions of the object surface readily visible by the application of suitable colorants, dyes, toners, etc. thereto, whereby to provide the requisite contrast with the object surface. Any such operation may be suitably accomplished either prior to or subsequent to the object surface etching operation. In some cases, an etching operation may not be required, i.e., the colorant, toner, etc. may be added to the object surface upon the completion of the solvent treatment or development step whereby the non-insolubilized portions of the resist forming layer are removed. Thus, regardless of the particular manipulative technique involved, it will be appreciated that the improved resist forming compositions of the present invention function to exceptional advantage as a mask pattern whereby to permit selective and differential treatment of the object surface bearing same, whether such treatment involves the use of etching media, colorants, or other agents. However, and as mentioned hereinbefore, the present invention has been found to be particularly efficacious in connection with operations including as an essential step, treatment with etching solutions of a highly active or corrosive nature in view of the exceptional resistance of the maleic anhydride polymer materials to such etching solutions.

The sensitivity, that is, response, of the maleic anhydried polymer layer to the corpuscular radiation employed for exposure may be further augmented or otherwise enhanced by the incorporation therein of one or more suitable monomeric cross-linking agents. Suitable representatives of such materials include for example, without necessary limitation, N,N'-methylene-bisacrylamide, acrylamide, divinyl benzene, styrene, ethylene glycol divinyl ether, etc. Such materials are well known in the art being extensively described in the published literature both patent and otherwise and in general encompass compounds containing at least one ethylenically unsaturated, non-aromatic double bond between adjacent carbon atoms activated by direct attachment to an electronegative group such as halogen, $>C{=}O$, $-C{\equiv}N$, $-C{\equiv}C-$, $-O-$, or aryl. The proportion of cross linking agent employed is obviously a matter of choice depending solely upon the results desired. However, it has been determined in general that beneficial results may be obtained by utilizing such materials in amounts ranging from 5 parts to about 50 parts by weight of the maleic anhydride polymer material, with a range of 10 parts to 20 parts being particularly preferred.

Although of an optional nature, it may nevertheless be desired to further augment the resistance of the insolubilized polymer areas to the etching solutions by a heat treatment operation. As mentioned previously, such heat treatments were necessary adjuncts to the prior art procedures currently known to the extent that the requisite degree of etch solution resistance depended critically thereupon. Such treatments may, if desired, be implemented by merely subjecting the insolubilized portions of the resist forming layer, following exposure, and resin etching, to elevated temperatures on the order of 120 to 140° C. for relatively short periods of time, e.g., 30 minutes to one hour.

The improved resistance of the maleic anhydride polymer layers of the present invention to the etching solution employed may be readily manifested by reference to the fact that coatings of approximately only 1 micron thickness possess exceptional resistance to the high activity acid solutions employed for etching aluminum surfaces, e.g., hydrochloric acid; this despite the absence of any heat treatment or other ancillary operation designed specifically to improve the resistance property. Usually, the propriety for the utilization of the heat treatment operation becomes more evident with coating thickness below 1 micron. In any event, one of the paramount advantages of the present invention is at once apparent; namely, the optional utilization of heat treatments in cases where the use of very thin layers or coatings is required.

Upon completion of the etching operation, it may be desirable to remove from the object surface the remaining insolubilized polymer resist areas. This may be readily accomplished with the use of suitable solvent media to the total exclusion of any necessity for the use of operations mechanical in nature, i.e., scraping, abrasion, etc. This step may be most conveniently accomplished by utilizing a solution capable of imparting hydrophilic properties to such insolubilized resin areas. Suitable reagents in this regard include for example and without limitation dilute solutions of ammonium, sodium, potassium or lithium hydroxide in water, water miscible solvents or mixtures thereof. Since the maleic anhydride polymer is readily convertible to a form soluble in aqueous alkaline media, the simple solution treatment suffices to accomplish the required removal.

The impenetrability of the maleic anhydride polymer resist compositions of the present invention to the etching solutions employed may be further enhanced by the incorporation in the coating composition of a long chain ethylenically unsaturated hydrocarbon compound. The latter substance effectively accelerates the rate of polymer insolubilization due to cross linking in much the same manner as the cross linking agents mentioned hereinbefore. Thus, such compounds undergo an alkene addition reaction with the polymer material, cross linking agent, etc., to thereby increase the molecular weight of the polymer material in the radiation-affected areas.

Thus, in the preparation of a printed circuit pattern utilizing one of the conventional metal-laminate materials, for example, a metal coated with a layer of plastic; the laminate is readied for use by applying a coating thereto of the maleic anhydride polymer material to a thickness within the range of from 0.1 to 50 microns preferably 0.5–10 microns. The exposure is thereupon effected utilizing either a programmed scanning beam or wide angle beam to an extent sufficient to render the radiation-struck areas insoluble. Physical removal of the non-insolubilized portions of the resist layer may then be effected by treatment with a ketone or other suitable solvent of the type mentioned hereinbefore. The copper etch is then effected by the use of an etching aqueous medium comprising for example a mixture of ammonium persulfate, mercuric chloride and concentrated sulfuric acid. Those portions of the copper layer not protected by the resist are readily removed by the etch solution. The remaining insolubilized resist portions may thereafter be removed simply by treatment with an ammonium hydroxide solution which converts the maleic anhydride polymer portions to a water soluble form and thus permits its removal. In this manner, there is thus obtained a printed circuit pattern of copper on a plastic substrate.

The present invention will be further illustrated by the following examples. It will be understood however, that such examples are given for purposes of illustration only and are not to be construed in any way as being limitative.

EXAMPLE I

A bimetallic plate comprising copper coated aluminum is immersed into a dilute nitric acid solution in order to clean the surface. After rinsing with water and drying, a resist forming composition comprising a 5% acetone solution of a 1:1 maleic anhydride-methyl vinyl ether copolymer having a specific viscosity of 2.0 measured at 25° C. as a 1% solution in methyl-ethyl ketone and commercially available from the General Aniline & Film Corporation under the trade name designation "Gantrez AN 149" is flow coated onto the copper layer to a thickness of 6 microns and allowed to dry. The thus coated plate is thereupon inserted into an enclosed chamber containing an electron beam gun. The internal pressure of the chamber is reduced to $10^{-6}$ mm. by evacuation. The exposure step is effected by subjecting a small section of the methyl vinyl ether maleic anhydride copolymer layer to the electron gun accelerated by a potential of 10 kv. whereby to yield an exposure value of $10^{14}$ electrons/cm.$^2$. Upon completion of the exposure dosage, the entire assemblage is immersed into an acetone solution in order to remove those portions of the coating not subjected to the electron beam. The non-exposed portions of the polymer coating are readily removed by the solvent treatment while those portions of the coating rendered insoluble by electron beam exposure remain totally unaffected by the acetone solvent. The solvent-etched assembly is thereafter placed in an oven heated to a temperature of 130° C. for about ½ hr. Upon completion of the heat treatment the plate is immersed in an etch solution of the following composition maintained at a temperature of 55° C.

Ammonium persulfate—227 grams
Mercuric chloride solution (1.34 gms./100 ml. water)—0.5 ml.
Sulfuric acid (conc.)—15 ml.
Water—1892 ml.

Those portions of the copper coating which are not protected by the insolubilized resist portions are readily removed by the etch solution in a period of approximately 10 min. However, those portions of copper layer protected by the insolubilized resist portions remain totally unaffected by the etch solution with absolutely no trace of spurious etch solution diffusion being detected. The insolubilized resist areas are thereafter removed from the copper surface by immersion in a dilute ammonium hydroxide solution thereby laying bare those portions of the copper layer unaffected by the etching treatment.

EXAMPLE II

Example I is repeated except that a copper clad laminate commercially available as Copper Fluoroply laminate sheet (Flexible Circuits Co., Hatboro, Pa.) is employed in lieu of the copper-aluminum bimetallic plate of Example I.

EXAMPLE III

A copper laminate identical with that employed in Example II is coated with a composition comprising a 2.5% methylethyl ketone solution of a 1:1 maleic anhydride-isobutyl vinyl ether copolymer having a specific viscosity of 2.9 measured with a 1% methyl-ethyl ketone polymer solution. The coating is applied to thicknesses of 5 microns. A portion of the isobutyl vinyl ether-maleic anhydride copolymer layer is thereafter subjected to an electron beam exposure of $10^{14}$ electrons/cm.$^2$ accelerated by 14 kv. Physical removal of the non-insolubilized resist portions is thereafter effected in the manner described in Example I. The plate element is then treated directly, i.e., absent any intermediate heat treatment with the etch solution having the composition described in Example I. As it is with the preceding examples, those portions of the copper layer protected by the insolubilized resist portions remain totally unaffected by the copper etch. Moreover, no spurious diffusion of solution is detected. The insolubilized polymer portions are then removed by treatment with a dilute solution of ammonium hydroxide.

EXAMPLE IV

Example III is repeated except that the resist forming composition employed comprises a 5% methyl-ethyl ketone solution of a 1:1 isobutyl vinyl ether-maleic anhydride copolymer having a specific viscosity of 1.8 as measured in a 1% methyl, ethyl ketone solution. The results obtained are similar to those described in the foregoing examples, i.e., the maleic anhydride copolymer layer was completely resistant to the effects of the etch solution thereby limiting the etching activity of the etch solution to those particular portions of the copper surface laid bare by the solvent removal step.

EXAMPLE V

Example III is repeated except that a 1:1 maleic anhydride-isobutyl vinyl ether copolymer having a specific viscosity of 0.6 in a 1% methyl-ethyl ketone solution is employed. Again, the resist produced via the electron beam exposure is completely resistant to attack by the copper etch solution.

EXAMPLE VI

Example I is repeated except that the resist forming composition employed comprises a 5% methyl-ethyl ketone solution of a 1:1 maleic anhydride-dodecyl vinyl ether copolymer having a specific viscosity of 0.3 as measured in a 1% methyl-ethyl ketone solution. Again, exposure is effected utilizing an electron beam accelerated by 10 kv. sufficient to provide an exposure of $10^{14}$ electrons/cm.$^2$. Following solvent removal of the non-insolubilized areas, the insolubilized resist portions were determined to be completely impervious to the etching solution and yet capable of ready removal upon completion of the etching process by immersion into a dilute ammonium hydroxide solution.

EXAMPLE VII

The procedure of Example I is repeated except that the resist forming composition employed comprises a 5% methyl-ethyl ketone solution of 1:1 hexadecyl vinyl ether-maleic anhydride copolymer having a specific viscosity of 0.2 as measured in a 1% methyl-ethyl ketone solution. The insolubilized resist material which forms in the radiation-effected areas of the maleic anhydride polymer layer is completely resistant to the copper etch solution.

EXAMPLE VIII

The procedure of Example I is repeated except that the resist-forming composition employed comprises a 5% methyl-ethyl ketone solution of 1:1 octadecyl vinyl ether maleic anhydride copolymer having a specific viscosity of 0.5 as measured in a 1% methyl-ethyl ketone solution. The insolubilized resist portions are ascertained to be completely impervious to and not attacked by the etch solution.

EXAMPLE IX

The procedure of Example III is repeated except that the resist forming composition employed comprises a 5% methyl-ethyl ketone solution of 1:1 maleic anhydride-isobutyl vinyl ether copolymers having a specific viscosity of 0.3 as measured in a 1% methyl-ethyl ketone solution. Upon exposure to an electron beam sufficient to yield an exposure dosage of $5\times10^{14}$ electrons cm.$^2$ there is obtained an insolubilized resist which is totally resistant to the copper etch solution.

EXAMPLE X

The procedure of Example IX is repeated except that the resist forming composition employed comprises a 2.5% solution of a maleic anhydride styrene copolymer having a specific viscosity of 1.8 as measured in a 1% methyl-ethyl ketone solution. Following exposure and processing as described in Example IX, there is obtained an insolubilized resist material which is totally impervious to the copper etch solution. Again, removal of the insolubilized resist areas from the laminate element upon completion of the processing is easily accomplished by immersing same in a dilute ammonium hydroxide solution.

EXAMPLE XI

A copper clad laminate of the type described in Example III is coated with a resist forming composition comprising a 2.5% solution of a maleic anhydride ethylene copolymer having a specific viscosity of 2.0 as measured in a 1% methyl-ethyl ketone solution. Resist formation is brought about by subjecting the maleic anhydride polymer layer to an electron beam exposure of $10^{14}$ electrons/cm.$^2$ accelerated by 14 kv. Physical removal of the non-insolubilized resist areas is effected by immersion in a solution of acetone. The laminate structure is thereupon subjected to a heat treatment for approximately ½ hour at a temperature of 150° C. Following the heat treatment operation, etching is accomplished in the manner described in Example I. The insolubilized resist areas are easily removed by immersion in a dilute ammonium hydroxide solution despite their exceptional resistance to the etching solution.

EXAMPLE XII

The procedure of Example III is repeated except that the copper clad laminate is coated with a resist forming composition comprising a 5% solution of 1:1 maleic anhydride-hexadecyl vinyl ether copolymer having a specific viscosity of 0.1% as measured in a 1% methyl-ethyl ketone solution. Again, the insolubilized material which forms as a result of the electron beam exposure is highly resistant to the copper etch solution.

Examples XIII to XV illustrate further embodiments of the present invention wherein cross linking agents are incorporated into the resist forming composition for purposes of improving the sensitivity of the maleic anhydride copolymer to the electron beam exposure.

EXAMPLE XIII

A copper clad laminate of the type described in Example III is coated with a 10% methyl-ethyl ketone solution of a 1:1 maleic anhydride isobutyl vinyl ether copolymer having a specific viscosity of 0.6 as measured in a 1% methyl, ethyl, ketone solution. Approximately 1% N,N'-methylene-bisacrylamide is added as a cross linking agent. The thus coated element is thereupon subjected to electron beam exposure of $1.6\times10^{12}$ electrons/cm.$^2$. The non-exposed i.e., non-insolubilized portions of the resist layer are thereafter removed by treatment with an acetone solution. The element is thereafter treated directly with a copper etch solution of the type described in Example I absent any intermediate heat treatment. The presence of the methylene bisacrylamide cross linking agent permitted the required exposure to be reduced significantly without any sacrifice in resist imperviousness to the etch solution. Moreover, the remaining resist portions are easily removed upon completion of the processing treatment with dilute ammonium hydroxide.

EXAMPLE XIV

The procedure of Example XIII is repeated except that approximately 1% of divinyl benzene is employed as the cross linking agent. An electron beam exposure of $1.6\times10^{13}$ electron per sq. cm. produces a resist which is not susceptible to attack by the etch solution while being easily removed with dilute alkali.

EXAMPLE XV

Example XIII is repeated except that approximately 1% of acrylamide is employed as the cross linking agent. An electron beam exposure of $8\times10^{13}$ electrons/cm.$^2$ provides a resist which is totally resistant to the etch solution.

The following example illustrates the beneficial effects of a long chain ethylenically unsaturated hydrocarbon upon the sensitivity of the copolymer composition to the electron beam.

EXAMPLE XVI

A copper clad laminate is coated with a resist forming composition comprising a 10% methyl-ethyl ketone solution of a 1:1 maleic anhydride isobutyl vinyl ether copolymer having a specific viscosity of 0.6 as measured in a 1% methyl-ethyl ketone solution. Approximately 1% by weight based upon the weight of the copolymer of 1-hexadecene is added. An electron beam exposure of $1.6 \times 10^{14}$ electrons/cm.$^2$ provides an etch-resistant resist which can be readily removed by treatment with dilute alkali. The etch resistance of the insolubilized resist portions is markedly superior to those produced from the same process but omitting the 1-hexadecene from the resist forming composition.

EXAMPLE XVII

This example illustrates the use of aluminum as the support metal.

An aluminum plate is coated with a 10% methyl-ethyl ketone solution of a maleic anhydride isobutyl vinyl ether copolymer having a specific viscosity of 0.6 as measured in a 1% solution of methyl-ethyl ketone. The element thus coated is thereafter subjected to an electron beam exposure of $5 \times 10^{14}$ electrons/cm.$^2$ accelerated by 14 kv. The non-insolubilized resist areas are thereupon removed by treatment with acetone. The resist obtained is completely resistant to a hydrochloric acid solution employed for accomplishing etching of the aluminum surface. The etch-resistant property is readily manifest from the fact that the etching activity of the hydrochloric acid solution is confined solely to those areas of the aluminum surface not protected by the resist layer.

EXAMPLE XVIII

This example illustrates the present invention utilizing silicon wafers as the support. A type N chemically polished silicon wafer is coated with a 10% methyl-ethyl ketone solution of a 1:1 maleic anhydride isobutyl vinyl ether copolymer having a specific viscosity of 0.6 as measured in a 1% solution of methyl-ethyl ketone. The element thus coated is thereafter heated for 15 min. at 100° C. and then subjected to an electron beam exposure of $5 \times 10^{14}$ electrons/cm.$^2$ accelerated by 14 kv. The non-solubilized parts of the layer are thereupon removed by treatment with acetone. The resist obtained is found to be resistive to a solution comprised of 4 parts 70% nitric acid, 3 parts acetic acid and 3 parts 48% hydrofluoric acid which etches the silicon.

EXAMPLE XIX

This example illustrates the present invention utilizing glass as the support.

Glass plate which has been etched with 6% hydrofluoric acid is coated with a 10% methyl-ethyl ketone solution of a 1:1 maleic anhydride isobutyl vinyl ether copolymer having a specific viscosity of 0.6 as measured in a 1% solution of methyl-ethyl ketone. The coating is thereafter subjected to an electron beam exposure of $5 \times 10^{14}$ electrons/cm.$^2$ accelerated by 14 kv. The non-insolubilized parts of the coating areas are thereupon removed by treatment with methyl-ethyl ketone. The resist obtained is resistant to 25% hydrofluoric acid solution that readily etches glass.

Examples XX to XXIII illustrate further embodiments of the present invention wherein resists are produced from coatings comprising mixtures of either polymaleic anhydride and polyalkyl vinyl ethers or one of these two polymeric materials with maleic anhydride copolymers.

EXAMPLE XX

A mixture of 1 part polymaleic anhydride and 1 part polyvinyl methyl ether is dissolved in 40 parts of acetone. A copper clad laminate is coated with the aforedescribed solution. The thickness of the coated layer is 5 microns. It is subjected to an electron beam exposure of $5 \times 10^{14}$ electrons/cm.$^2$ accelerated by 14 kv. The non-exposed parts of the coating are removed by treatment with methyl-ethyl ketone. The resist obtained is briefly heated for 15 min. at 150° C. and is thereafter resistive to the copper etch solution while being easily removed with dilute alkali.

EXAMPLE XXI

A mixture of 4 parts polyvinyl methyl ether and 1 part polymaleic anhydride is dissolved in 100 parts of acetone. A copper clad laminate is coated with the aforedescribed solution. The thickness of the coated layer is 7.5 microns. It is subjected to an electron beam exposure of $5 \times 10^{14}$ electrons/cm.$^2$ accelerated by 14 kv. The non-exposed parts of the coating are removed by treatment with methyl-ethyl ketone. The resist obtained is resistive to the copper etch solution while being easily removed with dilute alkali.

EXAMPLE XXII

A mixture of 1 part polymaleic anhydride and 3 parts 1:1 maleic anhydride-isobutyl vinyl ether copolymer is dissolved in 40 parts of methyl-ethyl ketone. A copper clad laminate is coated with the aforedescribed solution. The thickness of the coated layer is 5 microns. It is subjected to an electron beam exposure of $10^{15}$ electrons/cm.$^2$. The non-exposed parts of the coating are removed by treatment with methyl-ethyl ketone. The resist obtained is resistive to the copper etch solution while being easily removed with dilute alkali.

EXAMPLE XXIII

A mixture of 1 part polyvinyl methyl ether and 5 parts 1:1 maleic anhydride-isobutyl vinyl ether copolymer is dissolved in 300 parts methyl-ethyl ketone. A silicon wafer is coated with the aforedescribed solution. The thickness of the coated layer is approximately 0.5 micron. It is heated for 15 minutes at 150° C. and then subjected to an electron beam exposure of $10^{15}$ electrons/cm.$^2$. The non-exposed parts of the coating are removed by treatment with methyl-ethyl ketone. The resist obtained is resistive to a solution comprising 4 parts 70% nitric acid, 3 parts acetic acid and 3 parts 48% hydrofluoric acid.

EXAMPLE XXIV

Example XXIII is repeated except that an oxidized silicon base conventionally employed in the manufacture of microcircuits is employed in lieu of the silicon wafer. Following removal of the non-exposed areas of the coating with methyl-ethyl ketone, the oxidized surface of the silicon base is etched with the following solution:

Ammonium bifluoride—1400 grams
Hydrofluoric acid—420 ml.
Water—2100 ml.

The present invention has been disclosed with respect to certain preferred embodiments thereof, and there will become obvious to persons skilled in the art various modifications, equivalents or variations thereof which are intended to be included within the spirit and scope of this invention.

What is claimed is:

1. A process for the formation of a polymeric resist image which comprises imagewise exposing to an electron beam a surface coated with a resist forming composition consisting essentially of a polymer of maleic anhydride containing from about 10% to about 65% on a mole basis of maleic anhydride units and having a specific viscosity ranging from about 0.05 to about 5.0, said exposure being sufficient to cause insolubilization in those areas of the polymer layer affected by said electron beam exposure, and removing the non-insolubilized portions of said polymer layer by treatment with a solvent therefor.

2. A process according to claim 1, wherein said polymer comprises polymaleic anhydride.

3. A process according to claim 1, wherein said polymer comprises a copolymer of maleic anhydride with at least one mono-ethylenically unsaturated vinyl monomer copolymerizable therewith.

4. A process according to claim 3, wherein said copolymer comprises a copolymer of maleic anhydride with methyl vinyl ether.

5. A process according to claim 3, wherein said copolymer comprises a copolymer of maleic anhydride with isobutyl vinyl ether.

6. A process according to claim 3, wherein said copolymer comprises a copolymer of maleic anhydride with dodecyl vinyl ether.

7. A process according to claim 3, wherein said copolymer comprises a copolymer of maleic anhydride with hexadecyl vinyl ether.

8. A process according to claim 3, wherein said copolymer comprises a copolymer of maleic anhydride with octadecyl vinyl ether.

9. A process according to claim 3, wherein said copolymer comprises a copolymer of maleic anhydride with styrene.

10. A process according to claim 3, wherein said copolymer comprises a copolymer of maleic anhydride with ethylene.

11. A process for the production of an etched pattern which comprises imagewise exposing to an electron beam a surface coated with a resist forming composition consisting essentially of a polymer of maleic anhydride containing from about 10% to about 65% on a mole basis of maleic anhydride units and having a specific viscosity ranging from about 0.05 to about 5.0, said exposure being sufficient to cause insolubilization in those areas of the polymer layer effected by said electron beam exposure removing the non-insolubilized portions of said polymer layer by treatment with a solvent therefor, and treating the subjacent portions of the object surface laid bare by solvent removal with a composition capable of etching said object surface.

12. A process according to claim 11, wherein said polymer comprises a copolymer of maleic anhydride with at least one mono-ethylenically unsaturated vinyl monomer copolymerizable therewith.

13. A process according to claim 11, which includes the additional step of removing the insolubilized resist areas by treatment with a solubilizing substance capable of imparting hydrophilic character to said resist portions.

14. A process according to claim 13, wherein said solubilizing substance comprises an aqueous ammonium hydroxide solution.

References Cited

UNITED STATES PATENTS

| | | | |
|---|---|---|---|
| 2,990,281 | 6/1961 | Printy et al. | 96—35.1 |
| 3,297,440 | 1/1967 | Delzenne | 96—115 |
| 3,402,147 | 9/1968 | Stark et al. | 260—75 |
| 2,921,006 | 1/1960 | Schmitz et al. | 204—159.15 |
| 3,268,622 | 8/1966 | Stanton et al. | 204—159.15X |
| 3,286,025 | 11/1966 | Ingersoll | 178—6.6A |
| 3,372,100 | 3/1968 | Charlesby et al. | 204—159.15X |
| 2,893,868 | 7/1959 | Barney | 96—35.1 |

DAVID KLEIN, Primary Examiner

U.S. Cl. X.R.

96—35.1; 178—6.6; 204—159.15

Disclaimer 3,594,243.—*Albert S. Deutsch,* Vestal and *William G. Herrick,* Binghamton, N.Y. FORMATION OF POLYMERIC RESISTS. Patent dated July 20, 1971. Disclaimer filed Sept. 30, 1982, by the assignee, *Eastman Kodak Co.*

Hereby enters this disclaimer to all claims of said patent.

[*Official Gazette March 22, 1983.*]